United States Patent [19]
Norton

[11] Patent Number: 5,079,610
[45] Date of Patent: * Jan. 7, 1992

[54] STRUCTURE AND METHOD OF FABRICATING A TRAPPING-MODE

[75] Inventor: Paul R. Norton, Santa Barbara, Calif.

[73] Assignee: Santa Barbara Research Center, Goleta, Calif.

[*] Notice: The portion of the term of this patent subsequent to Apr. 3, 2007 has been disclaimed.

[21] Appl. No.: 545,108

[22] Filed: Jun. 27, 1990

Related U.S. Application Data

[63] Continuation of Ser. No. 804,719, Dec. 5, 1985, abandoned.

[51] Int. Cl.$^5$ .................. H01L 27/14; H01L 29/06; H01L 29/161
[52] U.S. Cl. .................................. 357/30; 357/16; 357/20; 357/32; 357/61
[58] Field of Search ............... 357/30 B, 30 E, 30 H, 357/30 Q, 29, 61, 16, 32, 20, 90

[56] References Cited

U.S. PATENT DOCUMENTS

| | | | |
|---|---|---|---|
| 3,799,803 | 11/1969 | Kraus et al. | 357/30 |
| 3,949,223 | 4/1976 | Schmit et al. | 357/30 |
| 4,081,819 | 3/1978 | Wong | 357/30 |
| 4,132,999 | 1/1979 | Maillé et al. | 357/30 |
| 4,206,003 | 6/1980 | Koehler | 357/30 |
| 4,411,732 | 10/1983 | Wotherspoon | 357/30 B |
| 4,435,224 | 3/1984 | Durand | 357/30 |
| 4,517,464 | 5/1985 | Heath et al. | 357/30 |
| 4,914,495 | 4/1990 | Norton et al. | 357/16 |

FOREIGN PATENT DOCUMENTS

| | | | |
|---|---|---|---|
| 2739309 | 3/1979 | Fed. Rep. of Germany | 357/61 |
| 2471053 | 6/1981 | France | 357/30 |

OTHER PUBLICATIONS

"1-2 Micron (Hg, Cd)Te Photodetectors," by Alan N. Kohn et al, published in IEEE Transactions on Electron Devices, vol. ED-16, No. 10, Oct. 1969, p. 885.

Primary Examiner—Andrew J. James
Assistant Examiner—Ngan Van Ngo
Attorney, Agent, or Firm—W. C. Schubert; W. K. Denson-Low

[57] ABSTRACT

Photodetectors that produce detectivities close to the theoretical maximum detectivity include an electrically insulating substrate carrying a body of semiconductor material that includes a region of first conductivity type and a region of second conductivity type where the region of first conductivity type overlies and covers the junction with the region of second conductivity type and where the junction between the first and second regions separates minority carriers in the region of second conductivity type from majority carriers in the region of first conductivity type. These photodetectors produce high detectivities where radiation incident on the detectors has wavelengths in the range of about 1 to about 25 microns or more, particularly under low background conditions.

15 Claims, 4 Drawing Sheets

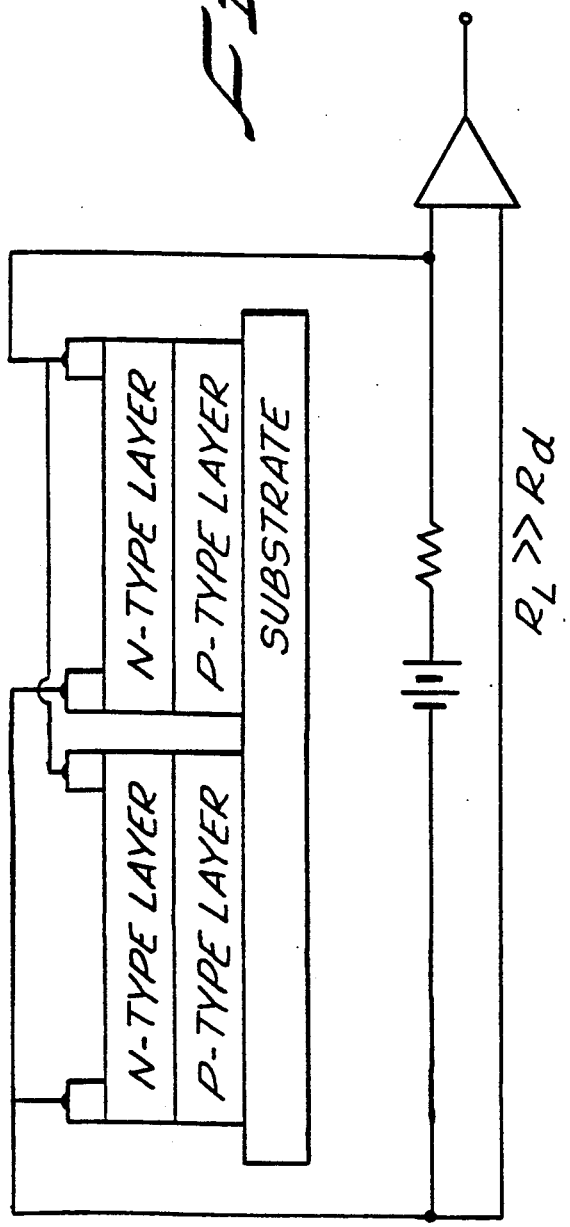

STRUCTURE AND METHOD OF FABRICATING A TRAPPING-MODE

This application is a continuation of application Ser. No. 06/804,719, filed Dec. 5, 1985, now abandoned.

1. FIELD OF THE INVENTION

This invention relates to photodetectors for producing detectable signals from incident radiation such as infrared radiation having wavelengths in the range of about 1 to about 25 microns, or more, particularly where the radiation appears in low background level energy fields, such as, for example, fields with background flux levels less than about $10^{17}$ photons/cm$^2$-sec.

2. BACKGROUND OF THE INVENTION

Photodetectors made of mercury cadmium telluride semiconductor material are disclosed in U.S. Pat. No. 3,949,223, issued Apr. 6, 1976, and entitled, "Monolithic Photoconductive Detector Array."

As the '223 patent discloses, when radiation of the proper energy falls upon a semiconductor, its conductivity increases. Energy supplied to the semiconductor causes covalent bonds to break, and electron/hole pairs (also called majority/minority carriers) in excess of those generated thermally are created. These increased current carriers increase the conductivity of the material. This so-called "photoconductive effect" in semiconductor materials is utilized in photodetectors.

A photodetector can be, for example, a bar of semiconductor material having electrical contacts at its ends. In one form, the photodetector is connected in series with a direct current voltage source and a load resistor. The change in conductivity of the detector in response to incident radiation is sensed in one of two ways. If the resistance of the load resistor exceeds the resistance of the detector, the device operates in the "constant current mode," since the current to the detector is essentially constant. In this mode, the change in conductivity of the detector is usually sensed by measuring the voltage across the detector.

If the resistance of the load resistor is less than the resistance of the detector, the detector is operating in the "constant voltage mode," since the voltage across the detector is essentially constant. The change in the conductivity of the detector is usually sensed by measuring the voltage across the resistor.

Of these two modes, the constant current mode finds wider use in detectors made from semiconductor materials having low resistivity.

Photodetectors, and particularly arrays of such detectors, have many applications. One application is in the detection of infrared radiation. Infrared sensitive photodetector arrays are used for various heat and object sensing applications.

One widely used infrared-sensitive photodetective material is mercury cadmium telluride, which consists of a mixture of cadmium telluride and mercury telluride. Cadmium telluride is a wide-gap semiconductor ($E_g = 1.6$ eV), and mercury telluride is a semi-metal having a "negative energy gap" of about minus 0.3eV. The energy gap of the alloy varies monotonically with x, the mole fraction of cadmium telluride in the alloy, $Hg_{1-x}Cd_xTe$. By properly selecting x, it is possible to obtain mercury cadmium telluride detectors having a peak response at any of a wide range of infrared wavelengths.

Mercury cadmium telluride photodetector arrays are now made by mounting a mercury cadmium telluride crystal on substrates with an epoxy. The thickness of the mercury cadmium telluride is then reduced to about 10 microns by lapping, polishing and etching. The detectors are then delineated and isolated by masking, and then cutting or etching. Electrical leads are attached to opposite ends of each of the individual detector elements, or to one end of each and a common.

Other methods for making such photodetectors are disclosed in the '223 patent. None of these methods is known to produce a detector that operates close to the theoretical maximum detectivity for radiation wavelengths in the range of about 1 to about 25 microns or more, particularly for wavelengths in the range of about 10 to about 25 microns or more, and particularly where such radiation appears in low background levels such as those having less than about $10^{17}$ photons/cm$^2$-sec.

3. SUMMARY OF THE INVENTION

The photodetectors of this invention produce detectivities close to the theoretical maximum detectivity of $2.52 \times 10^{18} \lambda (\eta/Q_B)^{\frac{1}{2}}$ cmHz$^{\frac{1}{2}}$/Watt, where $\eta$ is the quantum efficiency, and $Q_B$ is the background photon flux, and $\lambda$ is the wavelength of the radiation incident on the detector, and at least about $2 \times 10^{17} \lambda (\eta/Q_B)^{\frac{1}{2}}$ cmHz$^{\frac{1}{2}}$/Watt, where the radiation incident on the detectors is in the range of about 1 microns to about 25 microns or more, more particularly in the range of about 10 microns to about 25 microns or more. These detectors are particularly effective in producing signals from such incident radiation under low background radiation conditions, meaning radiation flux levels of less than about $10^{17}$ photons/cm$^2$-sec, and where the temperature under which the detector operates is sufficiently low to minimize thermal generation and recombination of excess carriers. In preferred embodiments, the duration of the signals produced by the new photodetectors at background levels in the range of about $10^{10}$ to about $10^{13}$ photons/cm$^2$-sec is at least about 50 microseconds and ranges as high as 100 microseconds or higher.

The new photodetectors comprise a substrate that is electrically insulating, such as a dielectric or wide bandgap semiconductor, attached to a body of semiconductor material comprising a region of first conductivity type and a region of a second, opposite conductivity type where the first region overlies the second. The region of first conductivity type has a narrow energy band-gap. The region of second, opposite conductivity type may have an energy band-gap substantially the same as, or different from the region of first conductivity type. This region of second type may have an energy band-gap that is substantially uniform and the same as or larger than the energy band-gap in the first region, or may vary, linearly or non-linearly, within the second region.

The method for making these new photodetectors comprises growing (depositing) a body of photoconductive material, epitaxially, on a substrate, and then annealing the epitaxially-grown photoconductive material to form the regions of first and second conductivity types atop the substrate. Where, as preferred, the photodetectors are made of mercury cadmium telluride material, the annealing takes place in a mercury vapor for a time sufficient to fill mercury vacancies in the portion of the semiconductor material referred to as the region of first conductivity type. After the annealing, the body of semiconductor material can be separated into a plurality of detectors by etching or other suitable technique.

After epitaxially growing the body of semiconductor material, an additional layer can be grown, epitaxially, atop the body of semiconductor material, to function as a means for minimizing diffusion of minority carriers to electrical contacts affixed to the top of the detectors.

4. BRIEF DESCRIPTION OF THE DRAWINGS

FIG. 4 shows a cross-sectional view of a detector of the present invention; and

FIG. 5 shows a cross-sectional view of a detector array of the present invention.

5. BRIEF DESCRIPTION OF THE INVENTION

Figure 1:
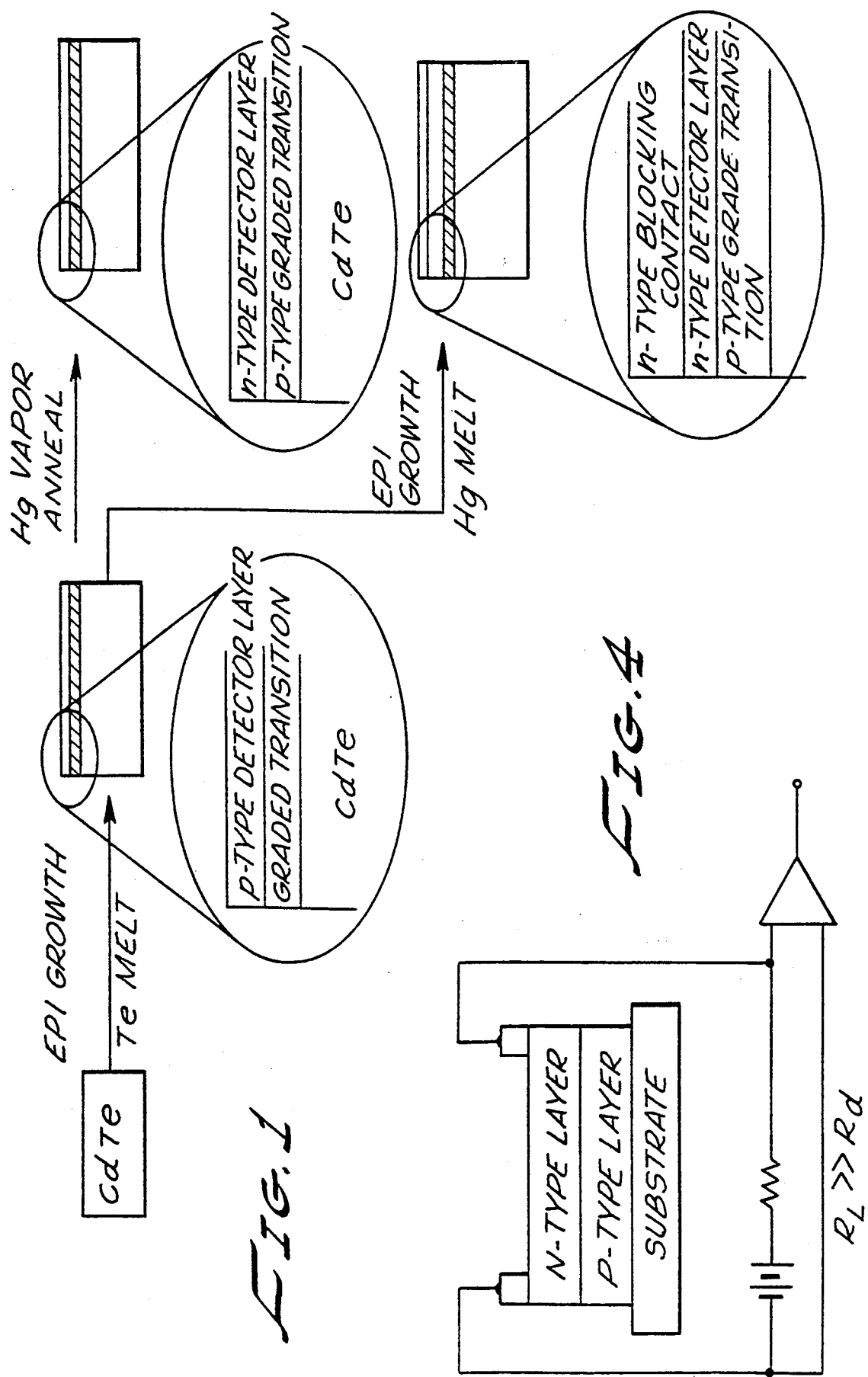
FIG. 1 shows a preferred embodiment of the method for making the new photodetectors of this invention.

The methods for making photodetectors of the kind shown in the drawings preferably utilize a tellurium-rich or mercury-rich melt including mercury telluride and cadmium telluride in molten form. Photodetectors made from such melts comprise mercury cadmium telluride having the general formula $Hg_{1-x}Cd_xTe$, where x is in the range of about 0.95 to about 0.13. While this detailed description speaks in terms of mercury cadmium telluride photoconductors, the methods of the invention and/or the structures produced are applicable to the manufacture of photodetectors from other substances, such as III-V, II-VI and IV-VI semiconductor alloys, particularly those having narrow band-gap detecting layers.

FIG. 1 shows a preferred method for making the photodetectors of this invention from mercury cadmium telluride. A dielectric or wide band-gap semiconductor substrate (such as a cadmium telluride substrate) of relatively high resistivity, meaning a resistivity in the range of about $10^3$ to about $10^8$ ohm-cm, is covered with a tellurium melt solution including a predetermined amount of mercury and cadmium. This tellurium melt solution is permitted to cool on the substrate to a temperature where the melt is supersaturated, thereby forming an epitaxial layer of mercury cadmium telluride thereon. Preferably, the epitaxially-deposited layer of mercury cadmium telluride has an excess of tellurium atoms or a deficiency of mercury atoms (mercury vacancies) in the crystal layer such that its electrical type is dominated by hole carriers (p-type). The p-type concentration, as grown, is typically in the $10^{15}$–$10^{18}/cm^3$ range. Alternately, a mercury melt solution may be used to grow the layer having the same properties.

After formation of the epitaxial layer, the substrate carrying the semiconductive, epitaxially grown layer is annealed, preferably in a vapor comprising mercury, at a temperature in the range of about 200° C. to about 300° C., for a time in the range of about 0.1 to about 100 hours, or at least for a time sufficient to form an n-type detector layer at the surface of the epitaxial semiconductor body, while retaining a p-type layer beneath the n-type detector layer, and with the PN junction of the two layers extending substantially along the length of the p-type layer (i.e., the p-type trapping region underlies the entire n-type detection layer). By controlling the time and temperature of annealing, the detector can be made with greatest sensitivity to incident radiation. Time and temperature of the annealing can be adjusted, depending upon the ratio of mercury to cadmium, the thickness of the epitaxial layer, the temperature of growth, and other factors, to achieve maximum practicable sensitivity.

The n-type detector layer is lightly doped, meaning that the concentration of electrons is $5 \times 10^{14}/cm^3$ or less so that the depletion layer width at the PN junction is substantial, and tunneling leakage, minimal. Also, the p-type region may lie substantially within a compositionally graded interface between the surface of the epitaxial layer and the substrate.

Before or after the annealing step, an additional layer may be deposited, epitaxially, on the surface of the n-type detector layer. This additional surface layer has a wider band-gap than the first epitaxial layer and can also be made of mercury cadmium telluride, preferably from a mercury melt solution including cadmium and tellurium, or may be made of cadmium telluride or other materials so that the layer prevents or minimizes diffusion of minority carriers to electrodes attached to the top of the detectors of this invention.

After the annealing step, or alternatively, after the annealing step and after application of the additional layer, the body of semiconductor material can be divided into a plurality of arrays by etching, or other known techniques. Thereafter, electrodes can be attached to each of the discrete detectors, or to as many as desired, to form a system including a plurality of the kind of detector shown in FIG. 4 as shown in FIG. 5. Insulating layers may be added to this structure to control the surface electrical and optical properties.

As FIG. 4 shows, an electrical bias may be applied to a detector by connecting the two electrodes on the detector in series with a battery and load resistor. The electrical bias may be applied by other means, a few examples of which are a pulsing direct current source, an alternating current source, direct connection to a transistor, a microwave generator or from an integrated circuit multiplexer readout chip.

Figure 2:
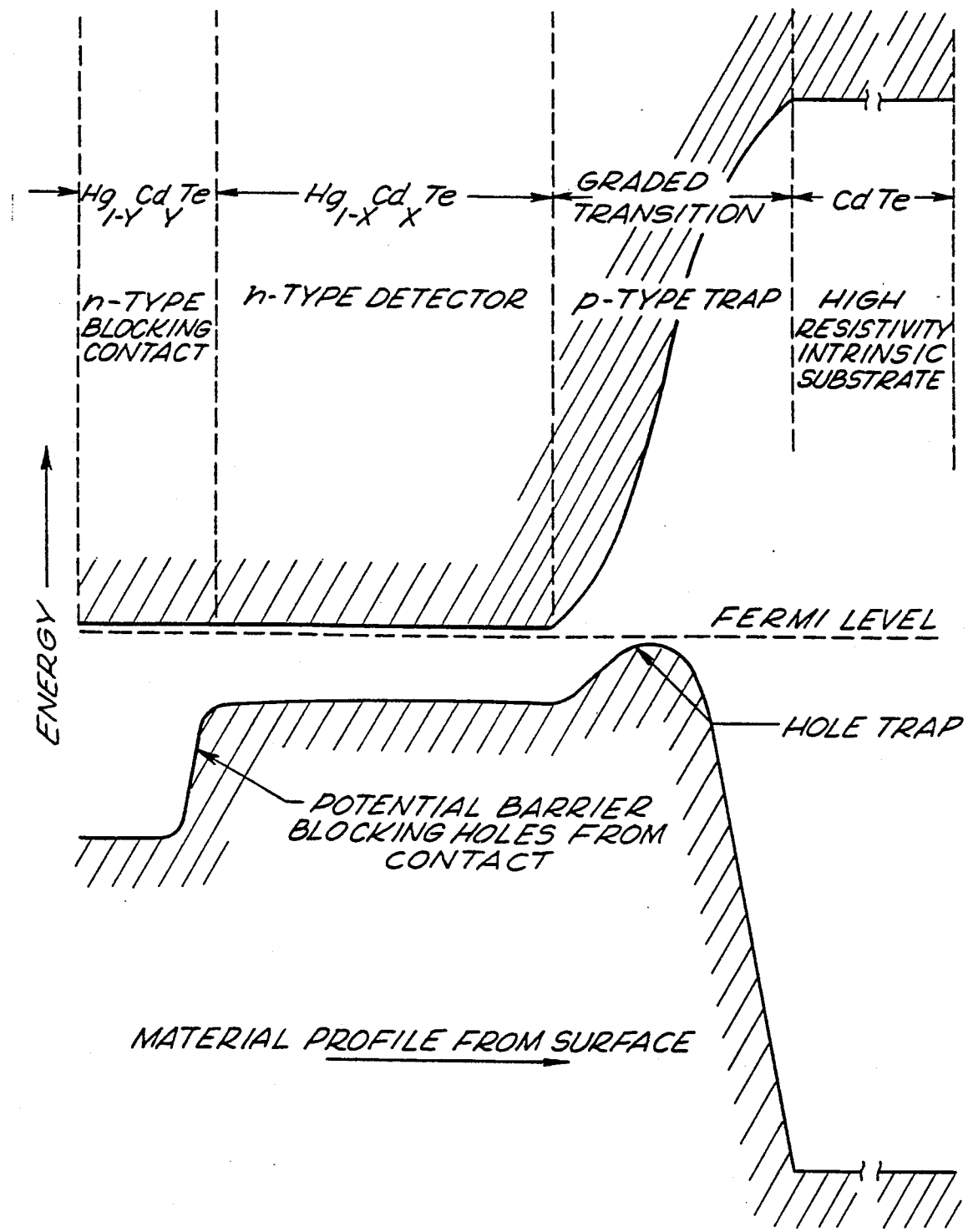
FIGS. 2 and 3 illustrate the structure and behavior of two preferred embodiments of the new photodetectors of this invention.
Figure 3:
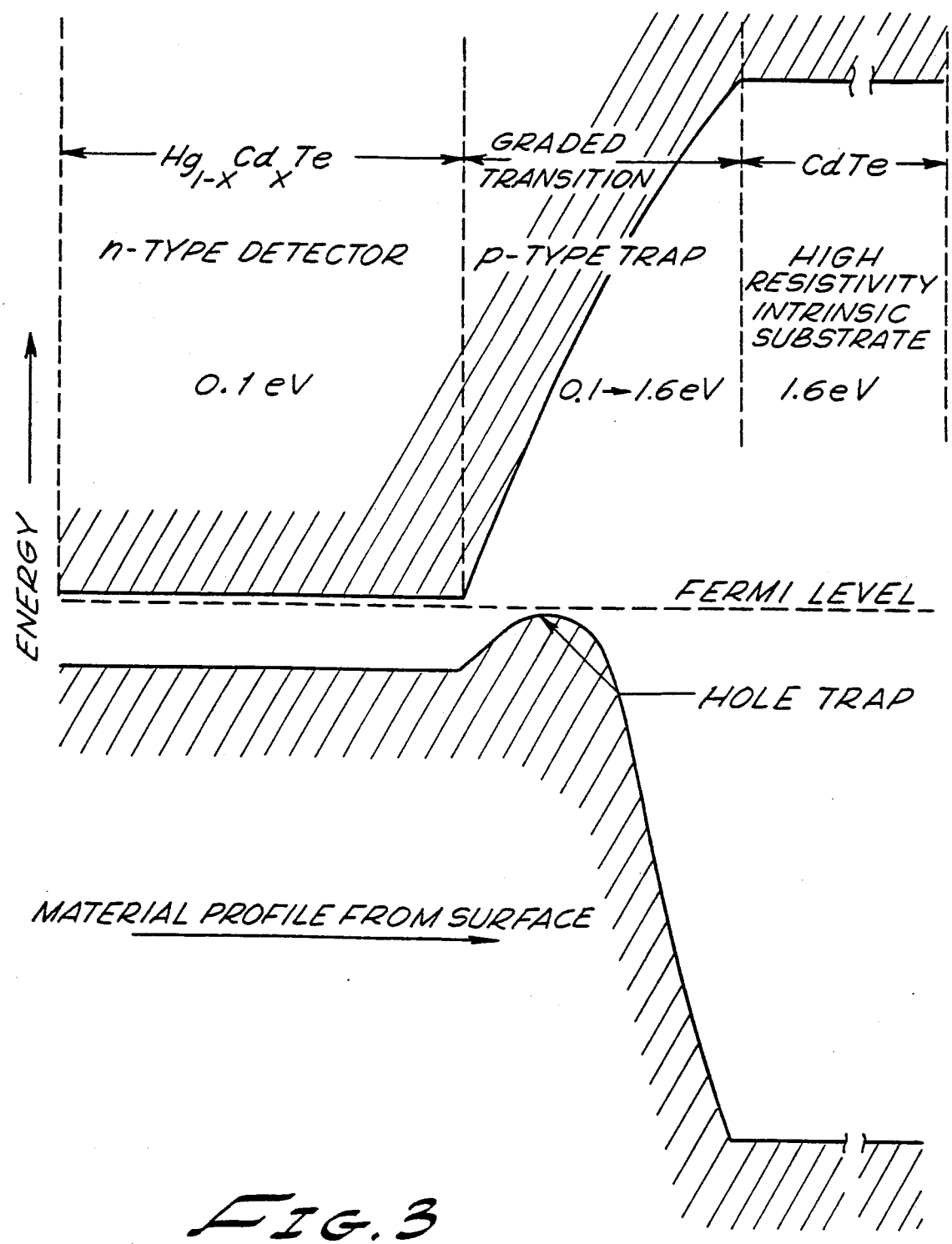

FIGS. 2 and 3 illustrate the electrical characteristics of the n-type and p-type layers in the photoconductors in their preferred mercury cadmium telluride embodiments. As they show, the n-type detector region atop the detectors has a small, relatively uniform energy band-gap which can be on the order of about 0.1 electron the n-type region. This low concentration produces a wide depletion layer at the PN junction which minimizes parasitic tunneling leakage currents between the p-type and n-type regions. For trapping minority carrier holes, the binding energy of the p-type region is substantially equal to the full energy band-gap of the detector layer, and may effectively be higher by virtue of being located within the compositionally graded interface between the surface of the epitaxial layer and the substrate. Accordingly, detectors made with this structure and by this method are less susceptible to performance degradation caused by tunneling leakage across the PN junction because of their wider depletion layers; less susceptible to surface leakage since the p-type layer may be more highly doped and located within a wider band-gap portion of the epitaxial layer; and more temperature stable because of the wider band-gap in the trapping p-type layer. One or more of these features, embodied in the new detectors, makes them superior to known detectors such as those disclosed in the '223 patent.

What is claimed is:

1. A photoconductor having a detectivity of at least about $2\times 10^{17} \lambda(\eta/Q_B)^{\frac{1}{2}}$ cmHZ$^{\frac{1}{2}}$/Watt, where $\lambda$ is the wavelength of radiation incident on said photoconductor, $Q_B$ is the background photon flux, and $\eta$ is the quantum efficiency, and where the radiation incident on said photoconductor is in the range of about 1 to 25 microns, and comprising an epitaxial region of first conductivity type substantially completely overlying an epitaxial region of second conductivity type, said epitaxial region of said second conductivity type substantially overlying an electrically insulating substrate, said epitaxial region of second conductivity type tending to trap, and to separate minority carriers from majority carriers in said epitaxial region of first conductivity type.

2. The photoconductor of claims 1 wherein said incident radiation appears under low background radiation conditions in the range of about $10^{17}$ to $10^6$ photons/cm$^2$-sec.

3. The photoconductor of claim 2 wherein said epitaxial of first conductivity type is an n-type region, and said epitaxial of second conductivity type is a p-type region.

4. The photoconductor of claim 3 wherein said electrically insulating substrate is a dielectric or wide band-gap semiconductor substrate.

5. The photoconductor of claim 4 wherein the n-type epitaxial region has a small, relatively uniform energy band-gap and is lightly doped, and the energy gap of the p-type epitaxial region is sufficiently greater than the full energy band-gap of the epitaxial n-type region to minimize electrical leakage at the surface between said n-type and p-type regions.

6. The photoconductor of claim 5 further comprising a layer overlying said epitaxial region of first conductivity type, said overlying layer minimizing diffusion and drifting of minority carriers to electrode means linked to said layer.

7. The photoconductor of claim 6 wherein said regions of first and second conductivity types are each comprised of mercury cadmium telluride, and are made from tellurimum-rich or mercury-rich alloys.

8. A photoconductor array comprising a subdivided body of semiconductor material, each of said photoconductors in said array having a detectivity of at least about $2\times 10^{17} \lambda(\eta/Q_B)^{\frac{1}{2}}$cmHz$^{\frac{1}{2}}$/ Watt, where $\lambda$ is the wavelength of radiation incident on said photoconductor, $Q_B$ is the background photon flux, and $\eta$ is the quantum efficiency, and where the radiation incident on said photoconductor is in the range of about 1 to 25 microns, and comprising an epitaxial region of first conductivity type substantially completely overlying an epitaxial region of second conductivity type, said epitaxial region of said second conductivity type substantially overlying an electrically insulating substrate, said epitaxial region of second conductivity type tending to trap, and to separate minority carriers from majority carriers in said epitaxial region of first conductivity type when radiation impinges on said photoconductor.

9. The photoconductor array of claim 8 wherein said incident radiation appears under low background radiation conditions in the range of about $10^{17}$ to about $10^6$ photons/cm$^2$-sec.

10. The photoconductor array of claim 9 wherein said epitaxial region of first conductivity type is an n-type epitaxial region, and said epitaxial region of second conductivity type is a p-type epitaxial region.

11. The photoconductor array of claim 10 wherein said electrically insulating substrate is a dielectric or wide band-gap semiconductor substrate.

12. The photoconductor array of claim 11 wherein the n-type region has a small, relatively uniform energy band-gap, and the energy gap of the p-type epitaxial region is sufficiently larger than the full energy band-gap of the n-type epitaxial region to minimize electrical leakage at the surface between said n-type and p-type regions.

13. The photoconductor array of claim 12 further comprising a layer overlying said body, said overlying layer minimizing diffusion and drifting of minority carriers to electrode means linked to said layer.

14. The photoconductor array of claim 13 wherein said epitaxial region of first and second conductivity types are each comprised of mercury cadmium telluride, and are made from tellurimum-rich or mercury-rich alloys.

15. An electromagnetic radiation detector system comprising a plurality of photodetectors as set forth in claim 1; electrodes connected to at least one of said photoconductors; means for applying electrical bias between said electrodes; and sensing means connected to said electrodes for sensing the change in conductivity of said photoconductors in response to incident radiation.

* * * * *